United States Patent [19]

Jalovec et al.

[11] Patent Number: 4,482,861
[45] Date of Patent: Nov. 13, 1984

[54] WAVEFORM MEASUREMENT AND DISPLAY APPARATUS

[75] Inventors: Lee J. Jalovec, Beaverton; Roland E. Andrews, Portland, both of Oreg.

[73] Assignee: Tektronix, Inc., Beaverton, Oreg.

[21] Appl. No.: 388,008

[22] Filed: Jun. 14, 1982

[51] Int. Cl.³ .............................................. G01R 23/16
[52] U.S. Cl. .............................. 324/77 B; 324/121 R
[58] Field of Search ................ 324/77 A, 77 B, 77 C, 324/77 CS, 121 R

[56] References Cited

U.S. PATENT DOCUMENTS

| | | | |
|---|---|---|---|
| 3,602,644 | 8/1971 | Rognon | 324/121 R |
| 3,641,554 | 2/1972 | Slavin | 324/121 R |
| 3,771,061 | 11/1973 | Bayer | 324/77 C |
| 3,872,461 | 3/1975 | Jarosik et al. | 324/121 R |
| 4,257,043 | 3/1981 | Tsuchiko | 324/121 R |
| 4,257,104 | 3/1981 | Martin et al. | 324/77 B |
| 4,306,186 | 12/1981 | Nakazawa et al. | 324/77 B |
| 4,364,036 | 12/1982 | Shimizu | 324/121 R |

*Primary Examiner*—Stewart J. Levy
*Attorney, Agent, or Firm*—George T. Noe

[57] ABSTRACT

A waveform measurement and display apparatus comprises a pair of signal-processing channels in addition to a sweep generator arranged so as to provide both Y-T and X-Y display modes. A time marker generator system is provided to insert time markers into the same relative time positions of the respective Y-T and X-Y displays so as to precisely ascertain the time relationship between the two displays. Additionally, such time markers may be inserted into corresponding time positions for expanded and unexpanded waveforms in the Y-T display mode so as to precisely ascertain the relative time position therebetween.

3 Claims, 6 Drawing Figures

WAVEFORM MEASUREMENT AND DISPLAY APPARATUS

BACKGROUND OF THE INVENTION

A waveform measurement and display apparatus, such as a transient recorder, waveform digitizer, or a digital storage oscilloscope, receives one or more analog electrical signals, converts such signals to digital form and stores them in waveform memory for subsequent retrieval and conversion back to analog form for display. Because the signals are digitized and stored, various processing and display modes may be implemented. For example, in a so-called pretrigger mode, signal segments which occur prior to a trigger event may be measured. Moreover, the stored waveforms may be processed by a computer to provide mathematical analysis thereof. For measuring graphic (or character) signals consisting of X (horizontal) and Y (vertical) coordinates, or for measuring timing components or phase relationships of two or more analog signals, an X-Y display may be provided.

In the case of a conventional waveform measurement apparatus which receives and digitizes two analog input signals and stores the digitized signals in two respective memory areas, the digital signals from the two memory areas are subsequently converted into analog output signals, and then applied respectively to the X-Y axes of a display device, such as a cathode-ray tube, to provide the X-Y display. However, it is often difficult to discern the time relationship between the two input signals from only the X-Y display. The conventional waveform measurement apparatus can display the two input signals simultaneously in a Y-T (wherein Y is amplitude and T is time) display mode so that the time relationship of the the two input signals may be analyzed. However, it is difficult to extrapolate a mental image of the X-Y display from the Y-T display of the two input signals. in addition, the conventional waveform measurement apparatus has the capability of expanding the Y-T display horizontally; that is, the time axis of the Y-T display can be expanded, but it is difficult to discern the time relationship between the expanded and unexpanded waveforms.

SUMMARY OF THE INVENTION

In accordance with the present invention, a waveform measurement and display apparatus is provided in which the foregoing disadvantages are overcome.

In a preferred embodiment, the apparatus comprises a pair of signal-processing channels in addition to a sweep generator arranged so as to provide both Y-T and X-Y display modes. In the Y-T display mode, either one or the other of the pair of signal-processing channels may be selected to coact with the sweep generator to provide a display, and in the X-Y display mode, one of the signal-processing channels may be selected to provide the X signal while the other provides the Y signal. In addition, time markers in the form of lines or intensified dots may be generated and inserted into the same relative time positions of the respective X-Y and Y-T displays so as to precisely ascertain the time relationship between the two displays. Furthermore, time markers may be inserted into the same relative time positions for expanded and unexpanded waveforms in the Y-T display mode so as to precisely ascertain the relative time position therebetween.

It is therefore one object of the present invention to provide a novel waveform measurement and display apparatus capable of discerning the time relationship between an X-Y display of two analog input signals and a Y-T display of at least one of the two input signals.

It is another object of the present invention to provide a waveform measurement and display apparatus in which the time relationship between expanded and unexpanded waveforms may be precisely ascertained.

Other objects, advantages, and features of the present invention will become apparent to those having ordinary skill in the art upon a reading of the following description when taken in conjunction with the drawings.

DRAWINGS

DETAILED DESCRIPTION OF THE INVENTION

Figure 1:
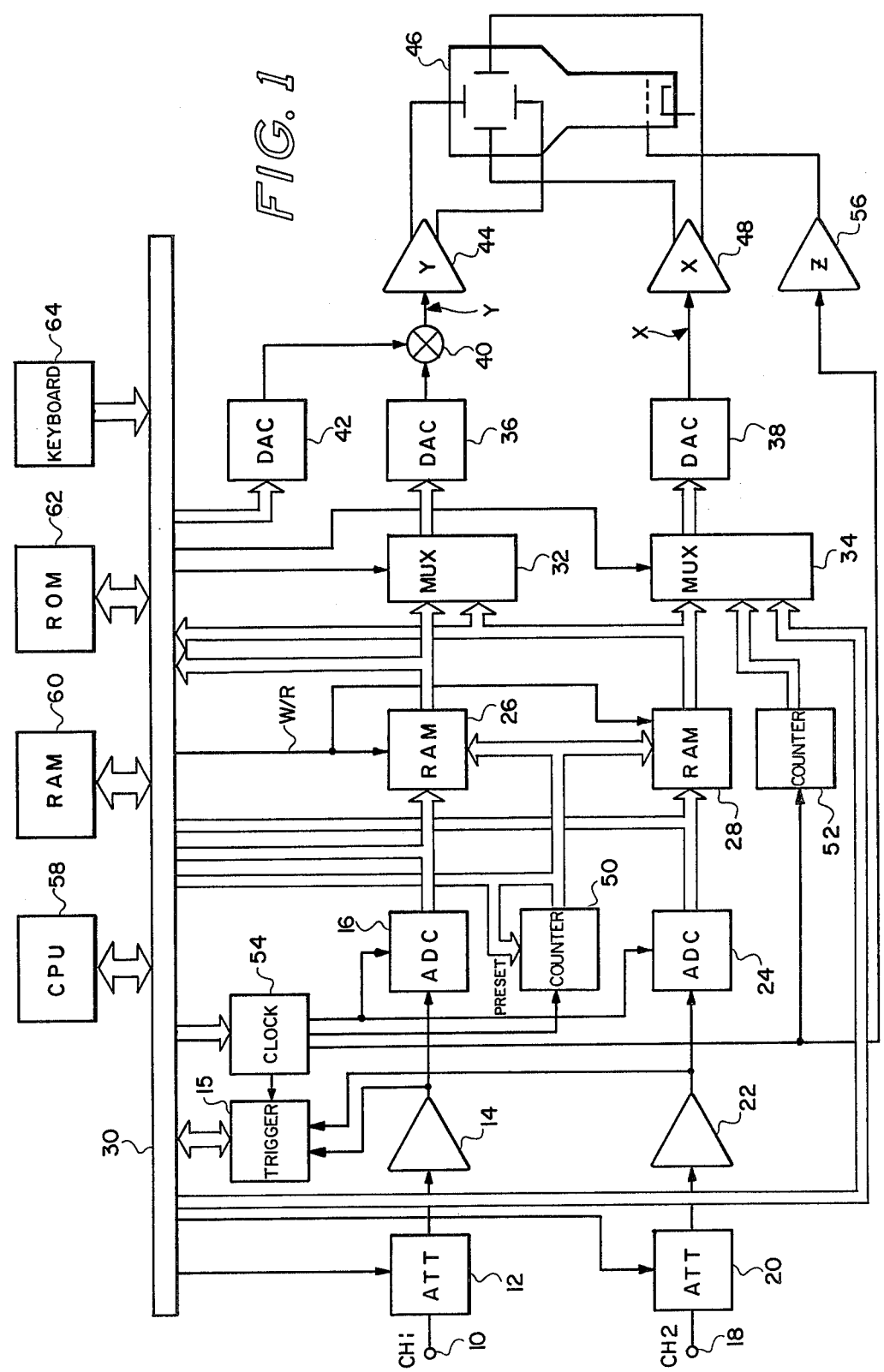
FIG. 1 is a block diagram of a preferred embodiment in accordance with the present invention.

Turning now to the drawings, there is shown in FIG. 1 a block diagram of a preferred embodiment of a dual-channel waveform measurement and display apparatus in accordance with the present invention. An analog signal at Channel 1 (CH1) input terminal 10 is applied through a programmable attenuator 12 and a buffer amplifier 14 to an analog-to-digital converter (ADC) 16. Similarly, an analog signal at the CH2 input terminal 18 is applied through a programmable attenuator 20 and a buffer amplifier 22 to ADC 24. The attenuation ratios of attenuators 12 and 20 are selectable and are controlled by command signals from a main bus 30, which includes data, address, and control lines. Trigger circuit 15 receives the outputs from amplifiers 14 and 22 so that a trigger point on either of the two analog input signals may be detected. Trigger circuit 15 may suitably include a programmable counter which starts to count a clock signal when the trigger point is detected, and in accordance with conventional practice a delay trigger (pretrigger) is available. Trigger circuit 15 receives trigger level data and delay time data (for the internal programmable counter) from the bus 30, and in turn outputs a trigger signal on bus 30. ADCs 16 and 24 convert the analog input signals into 8-bit digital signals which are applied to random-access memories (RAMs) 26 and 28, respectively. These RAMs may suitably be half-areas of a single RAM. RAM 26 further receives data and a write/read (W/R) control signal from bus 30, and applies the 8-bit output to bus 30 and to a multiplexer (MUX) 32. RAM 28 further receives data and the W/R control signal from bus 30, and applies the 8-bit output to bus 30 and MUXs 32 and 34. Selection control signals from bus 30 are applied to MUXs 32 and 34, and the outputs therefrom are applied to digital-to-analog converters (DACs) 36 and 38, respectively. A summing circuit 40 adds the output from DAC 36 to the output from DAC 42, which receives offset data from bus 30, and the output from summing circuit 40 is applied through push-pull output amplifier 44 to the Y-axis of a display device such as the vertical deflection plates of a cathode-ray tube (CRT) 46. The output from DAC 38 is applied through a push-pull output amplifier 48 to the X-axis, such as the horizontal deflection plates of CRT 46.

A 10-bit address counter 50 receives data from bus 30 at the preset terminal thereof, and RAMs 26 and 28 receive a 10-bit address signal from either bus 30 or counter 50. MUX 34 further receives the output from 10-bit counter 52 and two-bit data from bus 30. A clock generator 54 generates clock signals, the frequencies of which are determined in accordance with data from bus 30. The clock signals are applied to the counter portion of trigger circuit 15, ADCs 16 and 24, counters 50 and 52, and Z-axis amplifier 56, the output of which is applied to the grid of CRT 46. A central processing unit (CPU) 58 which may suitably be a microprocessor, is connected to bus 30 along with a CPU RAM 60, read-only memory (ROM) 62 and a keyboard 64. RAM 60 is used as a temporary memory for CPU 58, and ROM 62 stores firmware for controlling CPU 58. Keyboard 64 controls the selectable attenuation ratios of attenuators 12 and 20, the trigger level and position of trigger circuit 15, the clock frequency of clock generator 54, the W/R mode of RAMs 26 and 28, MUXs 32 and 34, etc., via CPU 58.

Figure 2:
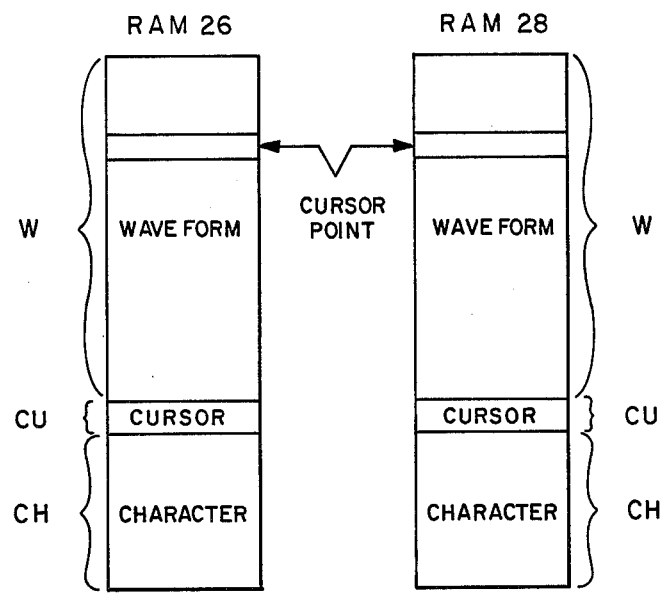
FIG. 2 shows the allotment of memory space for the X-Y display random access memories of FIG. 1.

The operation of the apparatus of FIG. 1 is as follows. In the writing mode, the user enters into the keyboard 64 the desired attenuation ratios of attenuators 12 and 20, the trigger level and position of trigger circuit 15 and frequency of clock generator 54. In execution, RAMs 26 and 28 receive a write command signal from bus 30. The analog input signals at terminals 10 and 18 are attenuated to proper amplitudes and applied to buffer amplifiers 14 and 22. ADCs 16 and 24 convert the analog outputs from amplifiers 14 and 22 into respective 8-bit digital signals, and the conversion speeds of these ADCs are determined by the clock frequency from clock generator 54. Counter 50 counts the clock signal to produce a sequential address signal. It should be noted that the clock signal to counter 50 is synchronized with the clock signal to ADCs 16 and 24. RAMs 26 and 28 store the 8-bit digital outputs from ADCs 16 and 24, respectively, in accordance with the address signal from counter 50. FIG. 2 shows memory maps for RAMs 26 and 28, and as can be seen, the memory space includes memory areas W for waveforms (the outputs from ADCs 16 and 24), areas CU for cursors and areas CH for characters. It should be noted that the outputs from ADCs 16 and 24 are stored in memory areas W of RAMs 26 and 28. Memory areas CH store the character information from bus 30, and such character information indicates in alphanumeric form the setting conditions such as the attenuation ratios, the clock frequency (time per division) or the like.

Figure 3:
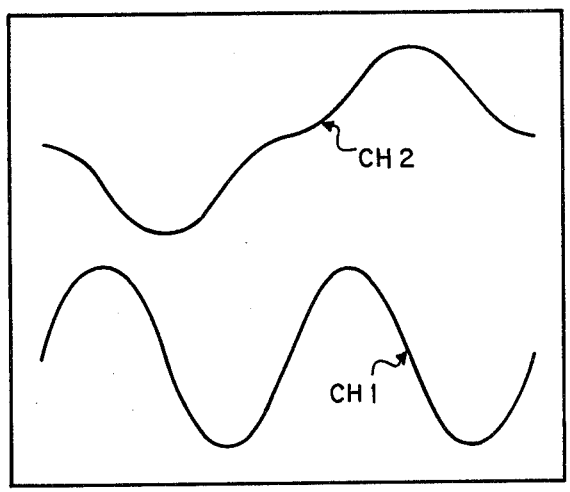
FIG. 3 shows a typical dual-channel waveform display.

When the display mode is selected, CPU 58 applies the read control signal to RAMs 26 and 28 via bus 30. In the Y-T display mode, MUX 34 selects the output from counter 52, which counts the clock signal from clock generator 54 to produce a 10-bit digital signal. DAC 38 converts this digital signal into an analog signal to produce a ramp signal to drive the horizontal sweep. In other words, the combination of counter 52 and DAC 38 comprises a sweep generator. During a first cycle of the sweep signal, MUX 32 selects RAM 26. During a second cycle of the sweep signal, MUX 32 selects the output from RAM 28. The output digital signal from MUX 32 is converted into an analog signal by DAC 36, and applied to CRT 46 through summing circuit 40 and output amplifier 44. DAC 42 generates an offset signal in response to the command from bus 30 so that the waveforms stored in RAMs 26 and 28 are displayed at different vertical positions on the screen of CRT 46 as shown in FIG. 3. In FIG. 3, CH1 and CH2 indicate the waveforms stored in RAMs 26 and 28, respectively, and any character information is not shown because it is not germane to this discussion. The above operations are controlled in accordance with CPU 58 and the firmware stored in ROM 62.

In the X-Y display mode, MUX 32 selects RAM 26 and MUX 32 selects RAM 28; that is, the waveform stored in RAM 28 becomes the X-axis signal and the waveform stored in RAM 26 becomes the Y-axis signal. DAC 42 generates the offset signal in this mode.

When the apparatus user wishes to discern the time relationship between the X-Y display and the Y-T display, both the Y-T and X-Y displays and cursors (markers) are displayed simultaneously as will be seen. The user selects the cursor point via keyboard 84, and the 10-bit address signal (corresponding to a point on the time axis of the waveform) of the cursor point is stored in RAM 60. The 8-bit data of RAM 26 at the cursor point is transferred to the memory area CU of RAM 26, and the 8-bit portion of the 10-bit cursor address signal in RAM 60 is transferred to the memory area CU of RAM 28 under control of CPU 58. It should be noted that the memory area CU may be one word (8-bit) capacity.

Figure 4:
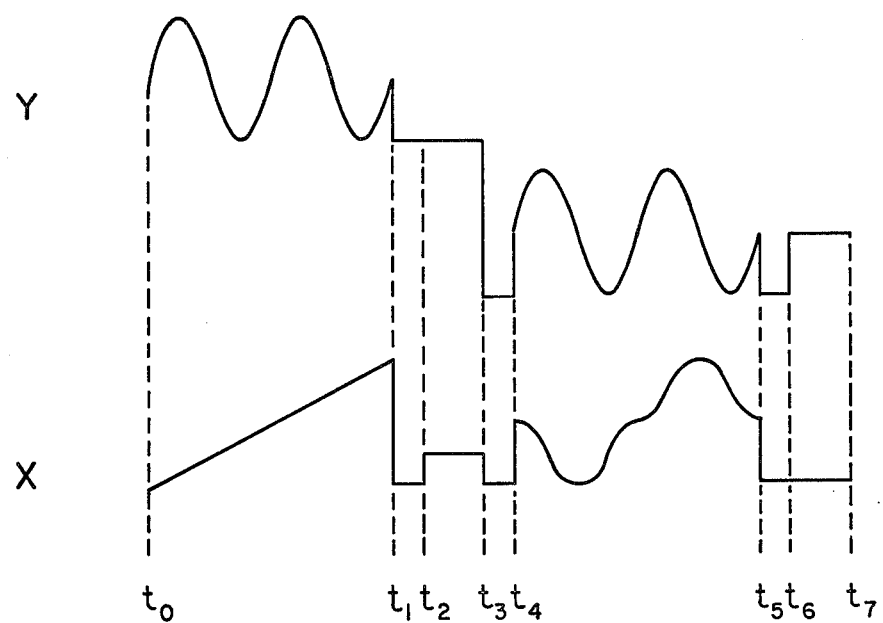
FIG. 4 shows a timing diagram for use in explaining the operation of FIG. 1.
Figure 5:
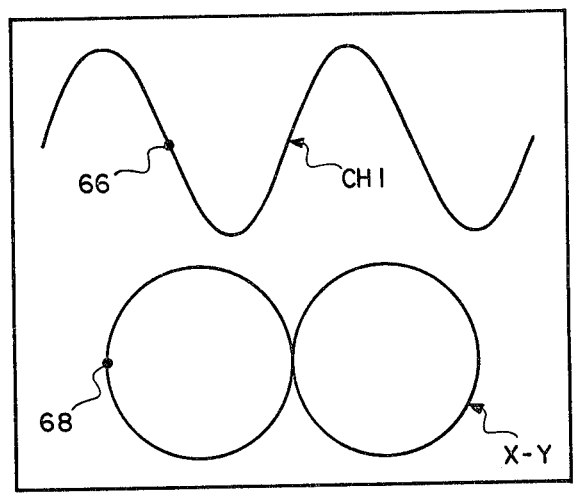
FIG. 5 shows a Y-T waveform display and an X-Y display, both of which have time markers inserted at the same relative time position.

FIG. 4 is a time chart illustrating the X-axis and Y-axis signals applied to output amplifiers 44 and 48. At time $t_0$, MUXs 32 and 34 select the outputs of RAMs 26 and 28, respectively. Memory area W of RAM 26 is addressed in sequence to read out the stored signal representations, and counter 52 counts the clock signal to produce the sweep signal as discussed hereinabove, so that the Y-T display of the waveform in RAM 26 (CH1) is displayed on the screen of CRT 46 as shown in FIG. 5. A period between times $t_1$ and $t_2$ is a rest period for the next step. At time $t_2$, address counter 50 addresses memory areas CU of RAMs 26 and 28, and MUX 34 selects RAM 28 and bus 30. Thus, DAC 36 receives the waveform data at the cursor point, and DAC 38 receives the 8-bit portion of the 10-bit cursor address signal from RAM 28 and the other two-bit portion from RAM 60 through bus 30. DACs 36 and 38 generate the cursor information during the period between times $t_2$ and $t_3$, and the electron beam bombards the same position of the screen of CRT 46 to indicate cursor 66 with intensity modulation. Thus cursor 66 appears as an intensified dot on the waveform display. The period between times $t_3$ and $t_4$ is a rest period for the next step. The characters stored in memory areas CH of RAMs 26 and 28 may be displayed as well; however, this operation is omitted in this description because it is not germane to the invention.

At time $t_4$, address counter 50 starts to address memory areas W of RAMs 26 and 28 in sequence in order to provide an X-Y display on the screen of CRT 46 as shown in FIG. 5. As described earlier, the waveforms in RAMs 26 and 28 are the Y-axis and X-axis signals respectively. DAC 42 applies an offset signal to summing circuit 40 in order to control the vertical position of the X-Y display. Thus the contents of memory areas W of RAMs 26 and 28 are read out between times $t_4$ and $t_5$, and at time $t_5$ the rest period starts for the next step. At time $t_6$, CPU 58 presets address counter 50 in accordance with the cursor address signal in RAM 60 and counter 50 addresses the cursor point in memory areas W of RAMs 26 and 28. DACs 36 and 38 generate cursor information during the period between times $t_6$ and $t_7$ and the electron beam bombards the same position of the screen of CRT 46 to indicate cursor 68 with intensity modulation. It should be noted that cursor 66 and 68 indicate the same relative time position of the Y-T display of the signal in Channel 1 in this instance, and the X-Y display of the signals of Channels 1 and 2. The above operations are controlled in accordance with CPU 58 and the firmware in ROM 62. If the user changes the cursor to another position via keyboard 64, the cursor address signal in RAM 60 is rewritten and the above operations repeat.

Figure 6:
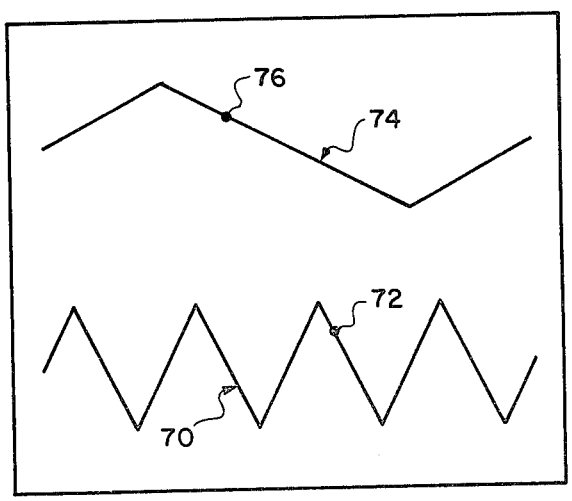
FIG. 6 shows a display of expanded and unexpanded waveforms each having time markers inserted into the same relative time positions.

FIG. 6 illustrates the screen of CRT 46 in the horizontal magnification mode. In this instance, RAM 26 has stored therein a digitized triangle waveform. Unmagnified waveform 70 and cursor 72 are displayed in the same manner as described for the Y-T display. In order to display magnified waveform 74, the clock signal from clock generator 54 is changed to a higher frequency signal in response to the command from bus 30. The magnification ratio is determined by the ratio of the read out clock frequency of waveforms 70 and 74. Cursor 76 is displayed in the same manner described earlier. It should be noted that the timing of cursor 76 corresponds to that of cursor 72. Cursor 72 may be moved along the waveform in accordance with a cursor command from keyboard 64; however, cursor 76 is stable at the predetermined horizontal position while waveform 74 moves horizontally in accordance with the cursor command because the starting address of counter 50 is preset by CPU 58 in accordance with the cursor position for waveform 74.

As understood from the foregoing description, the waveform measurement apparatus of the present invention is capable of displaying both the X-Y display of two input signals and the Y-T display of at least one of the two input signals against an internally generated sweep. Moreover, time markers may be inserted into the same relative time positions of the X-Y and Y-T displays, so that it is easy to discern the time relationship between the X-Y and Y-T displays. The apparatus in accordance with the present invention can also precisely ascertain the time relationship between the horizontally magnified and unmagnified waveforms in the Y-T display mode. These operations are controlled by CPU 58 and the firmware in ROM 62.

While the foregoing description pertains to a preferred embodiment of the present invention, it will be apparent to those having ordinary skill in the art that various modifications may be made without departing from the scope and spirit of the present invention. For example, while the time markers are discussed in terms of intensity modulated dots, such time markers may also be a cursor line or a spike. These types of markers may be generated in accordance with well-known techniques.

What I claim as being novel is:

1. A waveform measurement and display apparatus, comprising:
   a first and second signal-processing channel, each including means for converting a respective electrical signal to digital representations thereof, digital memory means for storing said representations, and means for converting said representations to analog values for display;
   means for selectively providing a Y-T display wherein at least one of said first and second signals is displayed along a time axis, and an X-Y display wherein said first signal is displayed along a first axis with respect to said second signal displayed along a second axis normal to said first axis; and
   means for storing time marker data at predetermined address locations and producing time markers at corresponding time positions of said Y-T and X-Y displays.

2. A waveform measurement and display apparatus in accordance with claim 1 further comprising means for changing the timing of at least one of said signals so as to provide expanded and unexpanded displays thereof, wherein said time marker producing means also produces time markers at corresponding time positions of said expanded and unexpanded displays.

3. A waveform measurement and display apparatus in accordance with claim 1 wherein said means for producing time markers comprises means for selecting relative time positions of one or more signals and generating intensified dots corresponding thereto.

* * * * *